United States Patent [19]

Nelson et al.

[11] 4,276,614

[45] Jun. 30, 1981

[54] ION-IMPLANTED MAGNETIC BUBBLE MEMORY WITH MERGE PORT

[75] Inventors: Terence J. Nelson; Raymond Wolfe, both of New Providence, N.J.

[73] Assignee: Bell Telephone Laboratories, Incorporated, Murray Hill, N.J.

[21] Appl. No.: 99,556

[22] Filed: Dec. 3, 1979

[51] Int. Cl.³ .............................................. G11C 19/08
[52] U.S. Cl. ......................................... 365/36; 365/15
[58] Field of Search ....................... 365/15, 36, 41, 13

[56] References Cited

U.S. PATENT DOCUMENTS

| | | | |
|---|---|---|---|
| 3,967,002 | 6/1976 | Almasi et al. | 365/41 |
| 4,040,019 | 8/1977 | Bullock | 365/41 |
| 4,142,250 | 2/1979 | Keefe et al. | 365/36 |

OTHER PUBLICATIONS

IBM Technical Disclosure Bulletin-vol. 17, No. 7, Dec. 1974, pp. 2196-2197.
Journal of Vacuum Science & Technology-vol. 15, No. 5, Sep./Oct. 1978, pp. 1675-1684.

*Primary Examiner*—James W. Moffitt
*Attorney, Agent, or Firm*—Herbert M. Shapiro

[57] ABSTRACT

A gap between sets of contiguous discs defined by unimplanted regions in an otherwise ion-implanted bubble layer allows a merge function to be achieved. The alignment of the gap axis with an axis of symmetry of the bubble layer and the width of the gap are important considerations in the performance of the merge.

4 Claims, 5 Drawing Figures

ION-IMPLANTED MAGNETIC BUBBLE MEMORY WITH MERGE PORT

FIELD OF THE INVENTION

This invention relates to magnetic bubble memories and more particularly to such memories in which bubbles move along paths defined by patterns of ion-implanted regions.

BACKGROUND OF THE INVENTION

Magnetic bubble memories are well known in the art. One mode of operating such memories is called a field access mode as is also well known. A field access mode bubble memory is characterized by a magnetic field reorienting, typically rotating, in the plane of bubble movement. Bubbles, in response to the cyclical changes in the magnetic field move along paths defined by magnetically soft elements such as permalloy or, more recently, by a repetitive pattern of ion-implanted regions.

The most attractive organization for a field access bubble memory is called the major-minor organization. This organization includes a plurality of closed-loop paths, termed minor loops, and a single major path. A bubble generator and a bubble detector are associated with the major path in spaced-apart positions operative to produce a bubble pattern in the major path and to detect such a pattern respectively.

Movement in all the paths is produced by the rotating magnetic field. Bubble movements in the minor loops and the major path thus are synchronous. Accordingly, bubble movement between the minor loops and the major path is achieved by the generation of appropriate magnetic control fields during a selected cycle of the magnetic field.

Commonly, the control fields are generated at the ends of the minor loops where those loops come into close proximity with the major path. At those ends, the geometries of the ion-implanted regions, for example, are different and an electrical conductor is coupled to the layer of bubble movement at the positions of close proximity so that bubbles can be moved between the minor loops and the major path by a pulse on the conductor during a selected cycle.

Frequently, a separate conductor couples positions of close proximity between minor loops and the major path at each set of ends of the minor loops. The elements and conductors at one set of ends are adapted to transfer bubble patterns into the minor loops; those at the other set of ends being adapted to transfer bubble patterns out of the minor loops. It can be seen that bubbles from the generator are organized in the major path for transfer into the minor loops for permanent storage while bubbles permanently stored in the minor loops are transferred out to the major loop for detection all in response to the rotating magnetic field and appropriately timed transfer-in and transfer-out pulses.

If transfer-out and transfer-in operations result in the movement of bubble patterns into and out of a single major path coupled to opposite ends of the minor loops, an inversion of the bubble pattern occurs. That is to say, the pattern transferred out at one end of the minor loops is inverted from the one transferred back in. This problem is overcome by the use of a G-shaped major path or loop as disclosed in copending application Ser. No. 018,310 filed for T. M. Burford, Mar. 7, 1979. The G-shaped organization introduces a compensating inversion of the bubble pattern.

If the G-shaped organization is implemented by ion implantation, either the transfer-out operation or the transfer-in operation is implemented in a manner to result in the movement of a bubble pattern between the minor loops and an auxiliary propagation path not opposed to the ends of the minor loops. That is to say transferred bubbles are moved to or from an auxiliary propagation path separated from the minor loops by a nonimplanted region. If the auxiliary path occurs at the transfer-out end of the minor loops as in the above-mentioned Burford application, for example, a merger of the auxiliary path and the major loop is desirable to avoid recirculation of data through the transfer-out region. An ion-implanted merge port is required at this juncture. The problem thus, is to provide an ion-implanted magnetic bubble memory with a passive merge port allowing bubbles from one of two paths to advance along a single path in an ion-implanted bubble memory.

BRIEF DESCRIPTION OF THE INVENTION

The present invention depends on the discovery that a separation between adjacent discs of first and second sequences of touching or contiguous discs, defined by nonimplanted regions in an otherwise ion-implanted layer, allows a bubble from one of two paths to advance along a single output path. To this end, the separation between the sets of discs, is of the order of the mean bubble diameter in the host layer and the separation is aligned with an axis of a preferred direction of magnetization in the plane of the host layer as defined in *Journal of Vacuum Science & Technology* Vol. 15, No. 5 September/October 1978 FIG. 12. The arrangement allows a merge port or function to be realized in an ion-implanted magnetic bubble memory. The arrangement is particularly useful in realizing the G-shaped major minor organization disclosed in the above-mentioned copending application.

DETAILED DESCRIPTION

Figure 1:
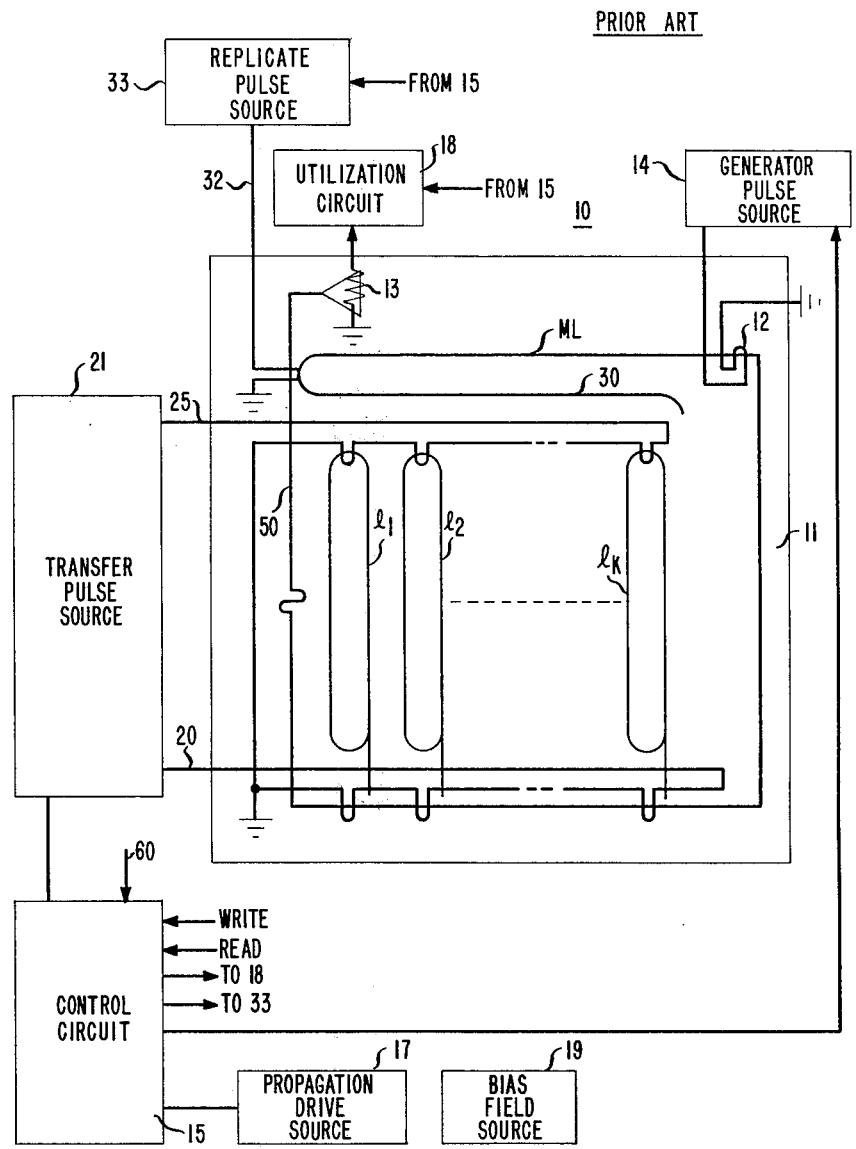
FIG. 1 is a block diagram of a prior art memory organization.

FIG. 1 shows a magnetic bubble memory 10 of the type disclosed in the above-mentioned copending application of T. M. Burford including a host layer 11 of a material in which magnetic bubbles can be moved. Bubbles are moved in layer 11 in closed loops, $1_1$, $1_2$-and $1_k$, the minor loops and a single loop ML, the major loop. In the illustrative embodiment, loop ML is folded into the G-shaped configuration mentioned hereinbefore.

Permanent storage of data is provided by the minor loops. The major loop, on the other hand, provides for access to the minor loops of substitute data from a bubble generator and for read out of addressed data at a detector. In this connection the generator comprises an electrical conductor 12 connected between a generator pulse source 14 and ground operative under the control of control circuit 15 to provide a pulse selectively during each cycle of a propagate drive source represented by block 17. The detector similarly comprises, for example, a conductor shown connected between a utilization circuit 18 and ground.

Bubbles are maintained at a nominal diameter by a bias field supplied by source 19.

We will adapt the convention that data, generated at 12, moves clockwise about loop ML to locations at the lower ends of minor loops $l_i$ in response to successive propagation cycles. A transfer-in electrical conductor 20 couples those ends of the minor loops with associated stages of the major loop for transferring new data into the minor loops at the proper time. Conductor 20, to this end, is connected between a transfer pulse source 21 and ground as shown.

A similar transfer operation, termed a transfer-out operation occurs at the top ends of the minor loops as viewed. The transfer-out operation is controlled by a pulse in electrical conductor 25 which is similarly connected between pulse source 21 and ground. The control of the transfer function as well as the generator, propagation and detector operation is derived from a master clock in accordance with well understood principles. Such circuitry along with an address register is considered to be included within control circuit 15.

The transfer-out operation moves addressed data from the minor loops into an auxiliary propagation path 30. Data in path 30 move from right to left as viewed passing along major loop ML and entering the transfer-in positions from the right as viewed in FIG. 1. The major loop to this point (actually a path) is seen to have a G-shape. The path is completed into a loop by a portion 50 which connects the left end of the transfer-in positions to path 30 as shown in FIG. 1.

The general organization of the memory of FIG. 1 thus can be seen to involve the generation of a bubble pattern at 12 for later storage in the minor loops by the activation of transfer conductor 20 during a write operation. Also involved is the transfer-out of addressed data from the minor loops by the activation of transfer-out conductor 25. The data transferred out advances to detector 13 for applying signals representative of bubble pattern to utilization circuit 18. The data moves clockwise along loop ML until a later transfer-in operation occurs. This later transfer-in operation moves the data back into vacancies at the bottom of the minor loops as viewed.

In this connection, it is helpful to recall that bubbles usually are moving synchronously in all the loops of the memory. When a transfer-out operation occurs, vacancies are left in the addressed bit locations in the minor loops. Those vacancies move about the minor loops as the transferred data move to detector 13 and thereafter move in loop ML. The number of stages in the minor loops and the number in the major loop are chosen so that data transferred-out or data generated at 12 arrive at the lower end of the minor loops synchronously with those vacancies. It also should be recognized that the transfer-out of data into path 30 rather than directly into the major loop ensures that the bits so transferred are in the proper sequence for a later transfer-in operation, the characteristic operation of the familiar G-shaped path. If the transfer-out operation resulted in direct transfer of data to major path ML, the bits would be reversed when transfer-in next occurred thus necessitating, for example, a more complicated transfer-in operation.

In FIG. 1, a portion 50 is added to major loop (actually path) ML. The portion connects to path 30 at one end, via a replicate conductor 32 connected between replicate pulse source 33 and ground, and may be thought of as a continuation of loop ML. Data transferred out to path 30 move normally to detector 13. It may be appreciated that although path 30, and major path loop ML and portion 50 can be seen to form a generally G-shaped major path for data portion 50 actually completes that path to form a loop.

Figure 2:
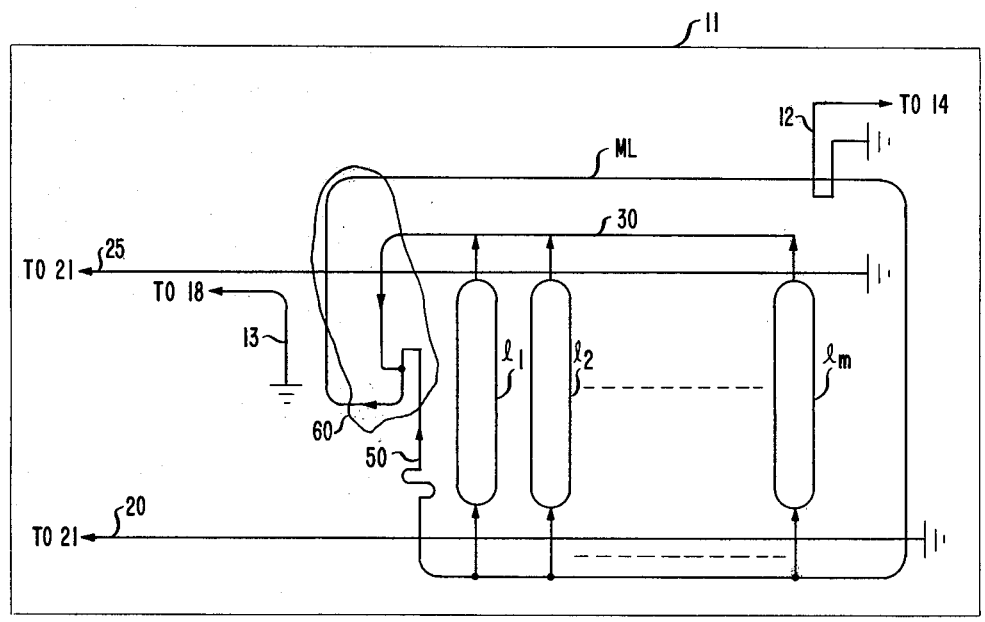
FIG. 2 is a block diagram of a magnetic memory of the type shown in FIG. 1, adapted in accordance with this invention.

FIG. 2 shows a line diagram of a G-shaped major minor, bubble memory of the type shown in FIG. 1, implemented by ion-implantation in accordance with one embodiment of this invention. Like designations are used as in FIG. 1 to show the correspondence with that figure. Thus, the auxiliary path is designated 30 in each of FIGS. 1 and 2 as is additional portion 50, for example.

But some of the elements of FIG. 1 are eliminated in the arrangement of FIG. 2, for example, no replication of data is employed and elements 32 and 33 of FIG. 1 are absent from the embodiment of FIG. 2. Rather an ion-implanted merge port couples path 30, portion 50 and major path ML such that data moving left on path 30 or upward in portion 50 move through the detector clockwise along path ML as is now explained more fully in connection with FIG. 3. Operation otherwise is exactly as described in the foregoing Burford application as will become clear hereinafter.

Figure 3:
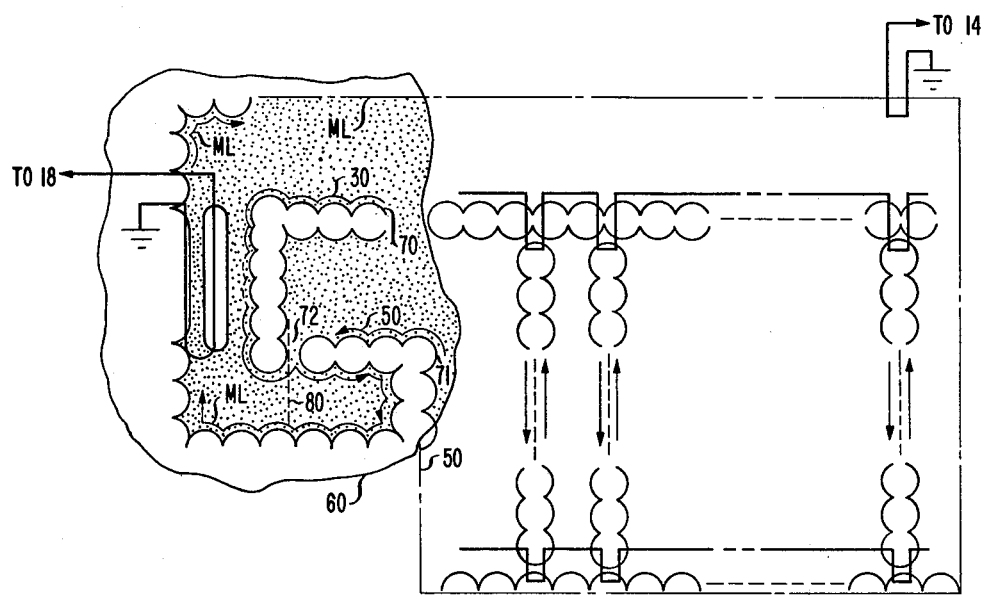
FIGS. 3 and 5 are enlarged top views of alternative portions of memories of the type shown in FIG. 2.

FIG. 3 shows the detail of a portion of an illustrative memory of the type shown in FIG. 2 implemented by ion-implanted disc-shaped elements. Each element is represented by a circular-shaped curve with alternating bulges and cusps, the cusps being directed toward the nonimplanted portion of the host layer.

FIG. 3 shows enlarged a portion 60 of the memory of FIG. 2 where paths 30 and portion 50 merge into a single output path ML. The ion-implanted portion of layer 11 in the area (60) of the merge is shown stippled in FIG. 3 defining contiguous disc geometries which appear as interleaved bulges and cusps. Path 30 is defined along the top edge of disc set 70, portion 50 along the upper edge of disc set 71. A gap 72 separates the two sets.

In response to a magnetic field rotating counterclockwise in the plane of layer 11, bubbles in portion 60 move right to left then downward (as viewed) along path 30 and right to left in portion 50 simultaneously. Because of the presence of the gap, bubbles in either path 30 or portion 50 ultimately move upward to the detector and then left to right along path ML.

This unexpected movement of bubbles in two different paths to a single output path is due to the formation of the gap in a manner to appear as a nonimplanted region to the bubble in path 30. Accordingly, the gap to that bubble appears as would a cusp between next consecutive discs. This formation of the gap to this end depends on the alignment of the gap axis 80 aligning with an axis of preferred position due to a preferred direction of magnetization of host layer 11 as defined in the above-mentioned publication.

Figure 4:
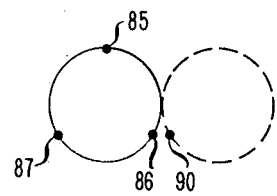
FIG. 4 is a schematic representation of the crystallographic symmetry of a bubble layer useful in the arrangement of FIG. 1.

FIG. 4 shows a circle with three dots 85, 86, and 87 on it periphery. The three dots represent the bubble-preferred directions on a nonimplanted disc due to the three-fold axes of symmetry which characterize cubic crystalline structure common to bubble materials. It is to be noted that axis 80 aligns with dot 85. Nonalignment of the axis makes the gap look less like a nonimplanted region to the bubbles in path 50 because preferred positions are not paired in the cusps in path 70. The pairing of cusps is the result of closely spaced preferred orientation of adjacent discs as represented by dots 86 and 90 in FIG. 4.

Moreover, for the preferred mode herein, the gap 72 has a width w (where $d/2 \leq w \leq 3/2d$) about as wide as the mean bubble diameter d in layer 11. For a 1.7 micron diameter bubble, a disc has a diameter of 8 microns and gap 72 is typically 2 microns. If the gap is less than about 1 micron, the circuit acts like no gap exists. If the gap is greater than about 3 microns, each disc set acts independently to circulate bubbles thereabout.

A bubble memory of the type shown in FIG. 2 has been made and tested. The merge function operated with margins of more than 20 Oe for a layer of YSm-LuCa-Ge-iron garnet. $1.7\mu$ thick with a bubble diameter of 1.7 mm. The ion-implanted region was formed by triple implantation of position ions 80/Ne+/1E14 (Ne+ ions at 80 Kev, $1 \times 10^{14}/cm^2$ of dose) +270/Ne+/- 2E14 +130/H$_2$+/2E16/cm$^2$. The nonimplanted discs were 8 microns (mm) in diameter.

Figure 5:
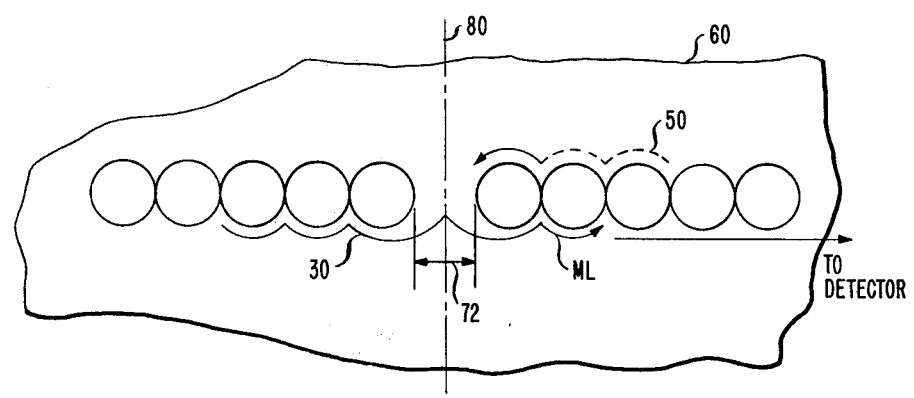

FIG. 3 shows the gap 72 defined between two sets of discs, one oriented horizontally and one oriented vertically. FIG. 5 shows a similar arrangement where both sets of discs are arranged horizontally. Like designation are used for ease of comparison.

The invention has been described in terms of contiguous discs. But the patterned ion-implant need not define discs. Rather any one of many periodic patterns may be used. One pattern for example may be shaped as a sinusoidal ribbon where cusps on one side of a nonimplanted region are interleaved with respect to the cusps on the other.

We claim:

1. A magnetic bubble memory comprising a host layer of magnetic material having a three fold axes of symmetry in which magnetic bubbles can be moved along first, second, and third paths in response to a magnetic field reorienting in the plane of said layer, a pattern of nonimplanted regions in said host layer for defining said paths in implanted regions thereabout, said nonimplanted regions defining first and second contiguous sets of periodic elements and an implanted gap separating said sets, said gap having an axis aligned with one of said axis of symmetry for moving bubbles from said first and second to said third paths.

2. A memory in accordance with claim 1 wherein said periodic elements comprise contiguous discs.

3. A magnetic bubble memory in accordance with claim 2 in which said bubbles have a mean diameter d and said gap has a width $$(d/2) \leq w \leq 3/2 \, d$$

4. A magnetic bubble memory in accordance with claim 2 wherein said gap has a width w=d.

* * * * *